(12) United States Patent
Erhardt et al.

(10) Patent No.: US 6,387,786 B1
(45) Date of Patent: May 14, 2002

(54) METHOD OF SALICIDE FORMATION BY SILICIDING A GATE AREA PRIOR TO SILICIDING A SOURCE AND DRAIN AREA

(75) Inventors: Jeff Erhardt, San Jose; Eric Paton, Morgan Hill, both of CA (US)

(73) Assignee: Advanced Micro Devices, Sunnyvale, CA (US)

(*) Notice: Subject to any disclaimer, the term of this patent is extended or adjusted under 35 U.S.C. 154(b) by 0 days.

(21) Appl. No.: 09/733,778

(22) Filed: Dec. 8, 2000

(51) Int. Cl.$^7$ ...................... H01L 21/285; H01L 21/335
(52) U.S. Cl. ........................ 438/586; 438/303
(58) Field of Search ................. 438/586, 303, 438/305

(56) References Cited

U.S. PATENT DOCUMENTS

| | | | | |
|---|---|---|---|---|
| 4,587,718 A | * | 5/1986 | Haken et al. ............... | 438/297 |
| 4,877,755 A | | 10/1989 | Rodder ....................... | 438/655 |
| 5,322,809 A | | 6/1994 | Moslehi ...................... | 438/592 |
| 5,891,785 A | | 4/1999 | Chang ........................ | 438/305 |
| 5,908,314 A | * | 6/1999 | Lin et al. .................... | 438/301 |
| 6,136,705 A | | 10/2000 | Blair .......................... | 438/682 |
| 6,171,959 B1 | * | 1/2001 | Nagabushnam ............. | 438/683 |
| 6,238,986 B1 | * | 5/2001 | Kepler et al. ............... | 438/301 |
| 6,255,215 B1 | * | 7/2001 | Hause et al. ................ | 438/682 |
| 6,268,257 B1 | * | 7/2001 | Wieczorek et al. .......... | 438/305 |
| 6,306,698 B1 | * | 10/2001 | Wieczorek et al. .......... | 438/197 |

OTHER PUBLICATIONS

"Manufacturability Issues related to Transient Thermal Annealing of Titanium Silicide Films in a Rapid Thermal Processor", Shenai, K. IEEE Transactions on Semiconductor Manufacturing. vol. 4, No. 1, Feb., 1991, pp. 1–8.*

"Correlation of Film Thickness and Deposition Temperature with PAI and the Scalability of Ti–Salicide Technology to Sub–0.18 Tm Regime" Ho, C.; Karunasiri, S.; Chua, S.; Pey, K; Siah, S.; Lee, K.; Chan, L. Interconnect Tech. Conference, 1998, pp. 193–195.*

"A Model for Titanium Silicide Film Growth" Borucki, L.; Mann, R.; Miles, G.; Slinkman, J.; Sullivan, T. Electron Devices Meeting, 1998. Technical Digest, Intl. 1998, pp. 348–351.*

* cited by examiner

*Primary Examiner*—Amir Zarabian
*Assistant Examiner*—Beth E. Owens
(74) *Attorney, Agent, or Firm*—Skjerven Morrill MacPherson LLP; Alex C. Chen

(57) ABSTRACT

The present invention relates to a method of forming a self-aligned silicide (salicide) by siliciding a gate area prior to siliciding a source and drain area and/or spacer formation. The method improves transistor speed by lowering the leakage current in the source and drain areas and lowering the polysilicon sheet resistance of the gate. As a result of one embodiment of the present method, a silicide is formed over the gate area that is advantageously thicker than silicide formations over the source and drain areas.

32 Claims, 1 Drawing Sheet

METHOD OF SALICIDE FORMATION BY SILICIDING A GATE AREA PRIOR TO SILICIDING A SOURCE AND DRAIN AREA

BACKGROUND OF THE INVENTION

1. Field of the Invention

This present invention relates to a method of forming a salicide. In particular, the present invention relates to a method of forming a salicide by siliciding a gate area prior to siliciding a source and drain area and/or spacer formation.

2. Description of Related Art

A conventional transistor comprises a source area, a drain area and a gate area between the source and drain areas.

SUMMARY

The present invention relates to a method of forming a self-aligned silicide (salicide) by siliciding a gate area prior to siliciding a source and drain area or spacer formation. The method improves transistor speed by lowering the leakage current in the source and drain areas and lowering the polysilicon sheet resistance of the gate. As a result of one embodiment of the present method, a silicide is formed over the gate area that is advantageously thicker than silicide formations over the source and drain areas. The silicide formations formed over the source and drain areas are advantageously shallow, such that the silicide formations do not impede the junction and cause current leakage.

One aspect of the invention relates to a method of forming a silicide. The method comprises conformally forming a first metal layer over a gate area and a gate dielectric layer. The gate dielectric layer covers a source area and a drain area. The method further comprises applying a first thermal anneal that causes the metal layer to at least partially react with the gate area to form a first silicide layer over the gate area. The method further comprises removing any unreacted metal from the first metal layer over the gate dielectric layer, and removing the gate dielectric layer over the source and drain areas. The method further comprises forming a second metal layer over the first silicide layer and the source and drain areas. The method further comprises applying a second thermal anneal, wherein the second thermal anneal causes (1) the second metal layer to further react with the gate area to enhance the first silicide layer, and (2) the second metal layer to at least partially react with the source and drain areas to form second and third silicide layers. The method further comprises removing any unreacted metal from the second metal layer.

Another aspect of the invention relates to a product made by the method above.

The present invention will be more fully understood upon consideration of the detailed description below, taken together with the accompanying drawings.

DETAILED DESCRIPTION

Figure 1:
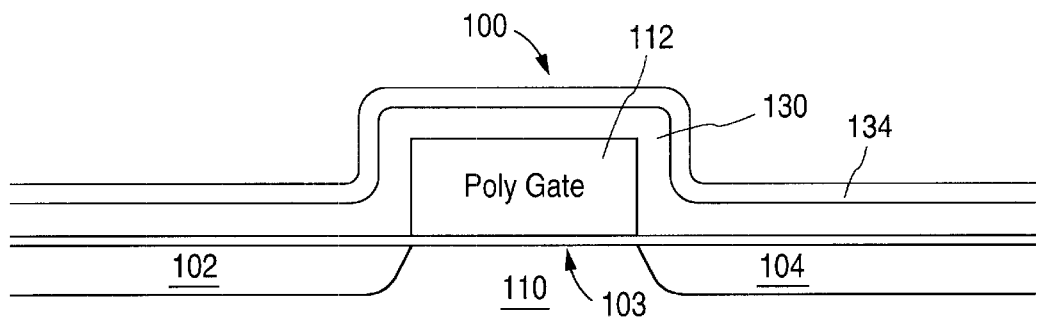
FIG. 1 illustrates one embodiment of a device at a first phase of development.

FIG. 1 illustrates one embodiment of a device 100 at a first phase of development. The device 100 comprises a substrate 110, a source area 102, a drain area 104, a gate dielectric layer 103, a gate area 112, and a first metal layer 130.

In one embodiment, the gate area 112 comprises a polysilicon, and the gate dielectric layer 103 comprises an oxide. In one embodiment, the substrate 110 is doped with P-type dopants, while the source and drain areas 102, 104 are doped with N-type dopants. One of ordinary skill in the art will appreciate that the substrate 110 may be doped with N-type dopants, while the source and drain areas 102, 104 are doped with P-type dopants.

In one embodiment, the device 100 of FIG. 1 is fabricated by forming the gate dielectric layer 103 on the substrate 110 and depositing a polysilicon layer on top of the gate dielectric layer 103. The gate area 112 is then etched, but the etch stops on the gate oxide dielectric 103. The first metal layer 130 is deposited on the gate area 112 and on the gate dielectric layer 103 by using a deposition process such as, for example, physical vapor deposition (PVD), chemical vapor deposition or some other suitable process. The metal layer 130 may comprise a rare earth or transition metal in Groups 3B–8B and Groups 1B and 2B. For example, the metal layer 130 may include Co, Ti, W, Ni and/or Mo.

Next, a capping layer 134 may be formed on top of the metal layer 130. The capping layer 134 may include a material such as Ti, Al, Li, Mg and/or Ca. These elemental metals typically have good gettering ability, a large thermodynamic drive for oxidation and reactivity with impurities. To advantageously achieve a low polysilicon line/sheet resistance of the gate area 112, the metal layer 130 is preferably deposited conformally onto the polysilicon gate area 112 and over the gate dielectric layer 103.

If silicide at the bottom of the gate in contact with the source and drain areas 102, 104 presents difficulties with transistor electrical properties, then a direction metal deposition, such as collimated, long throw or ionizing plasmas, may be used. However, for some types of advanced devices this may be desirable due to modification of the work function at the gate edge. A direction metal deposition would prevent metal from depositing on the sidewalls of the polysilicon gate 112.

Figure 2:
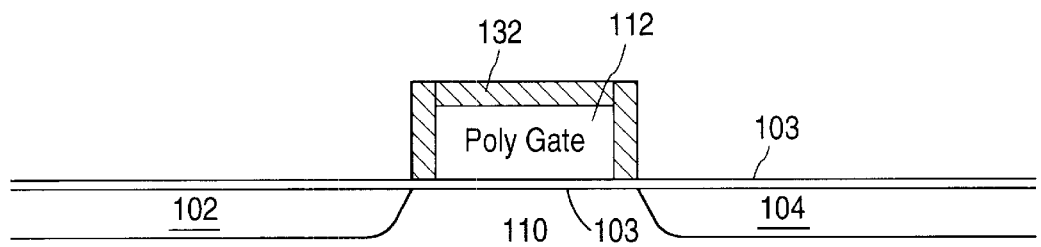
FIG. 2 illustrates the device of FIG. 1 at a second phase of development.
Figure 3:
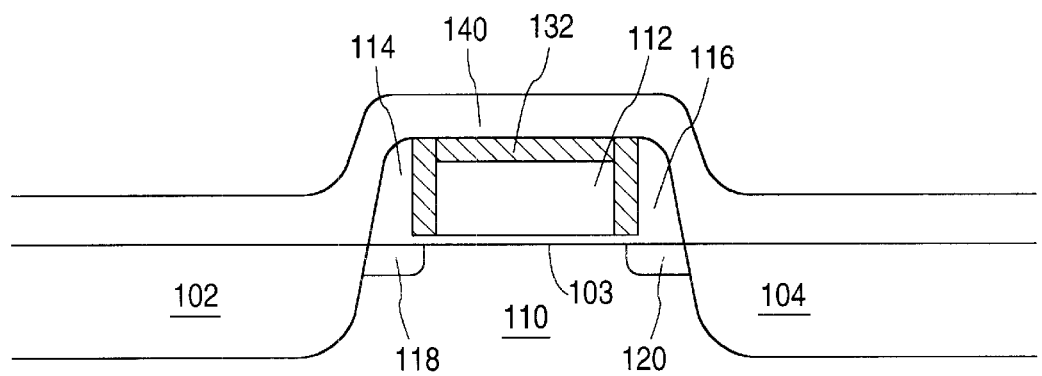
FIG. 3 illustrates the device of FIG. 1 at a third phase of development.

FIG. 2 illustrates the device 100 of FIG. 1 at a second phase of development After depositing the metal layer 130, a thermal anneal (also called a rapid thermal anneal) causes the metal layer 130 and the capping layer 134 to react with the gate area 112 (called a dual reaction or silicide reaction). The silicide reaction on the gate area 112 forms a silicide layer 132 on the top and vertical sides of the-gate area 112, as shown in FIG. 2. The thermal anneal may range in temperature, for example, from about 300 degrees C. to about 600 degrees C. The gate dielectric layer 103 may advantageously slow down or prevent the source and drain areas 102, 104 from a silicide reaction. The anneal may use a traditional furnace, rapid thermal anneal (RTA) or laser. Any unreacted metal from the metal layer 130 over the gate dielectric layer 103 is removed with a wet or dry strip. A number of processes may be used to ship the unreacted metal layer 130, such as for example, by using ammonium peroxide, hydrogen peroxide or sulfuric acid FIG. 3 illustrates the device 100 of FIG. 1 at a third phase of development. A spacer layer is deposited and etched to form first and second spacers 114, 116. The spacers 114, 116 may be an oxide or nitride. A further ion implantation step may be carried out to introduce additional dopants into sore and drain areas 102, 104, which forms doped areas 102, 104 and lightly-doped areas 118, 120. A second metal layer 140 similar to the first metal layer is then deposited. Gate dielectric layer 103 over the source and drain regions 102, 104 is removed prior to deposition of metal layer 140. The second metal layer 140 is preferably directly contacting the silicon surface of the source and drain areas 102, 104.

Figure 4:
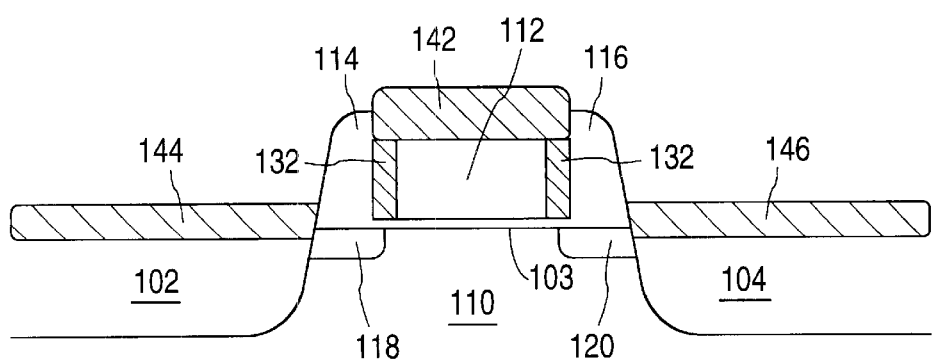
FIG. 4 illustrates the device of FIG. 1 at a fourth phase of development.

FIG. 4 illustrates the device 100 of FIG. 1 at a fourth phase of development. In FIG. 4, a second thermal anneal is performed. The second anneal may range in temperature, for example, from about 300 degrees C. to about 600 degrees C. This second anneal advantageously causes the second metal layer 140 to react (1) with the gate area 112 to form an enlarged first silicide 142 and (2) with the source and drain areas 102, 104 to form second and third silicide layers 144, 146. Unreacted portions of the second metal layer 140 are etched or stripped away. A number of processes may be used to strip the unreacted metal layer 130, such as for example, by using ammonium peroxide, hydrogen peroxide, sulphuric acid, etc.

The enlarged first silicide 142 over the gate area 112 is advantageously thicker than the second and third silicide layers 144, 146 over the source and drain areas 102, 104. In one embodiment, the resulting silicide formation 132 is about 2 to 3 times thicker than the silicide layers 144, 146 formed over the source and drain areas 102, 104. The desired thicknesses of the silicide layers 142, 144, 146 may be controlled by controlling the thickness of the deposited metal layers 130, 140 and/or the temperature of the thermal anneals.

The method described above improves transistor speed by lowering the leakage current in the source and drain areas 102, 104 and lowering the polysilicon sheet resistance of the gate area 112.

The above-described embodiments of the present invention are merely meant to be illustrative and not limiting. It will thus be obvious to those skilled in the art that various changes and modifications may be made without departing from this invention in its broader aspects. The appended claims encompass all such changes and modifications as fall within the true spirit and scope of this invention.

What is claimed is:

1. A method of forming a silicide, the method comprising:
conformally forming a first metal layer over a gate area and a gate dielectric layer before forming spacers adjacent to the gate area, the gate dielectric layer covering a source area and a drain area;
applying a first thermal anneal that causes the first metal layer to at least partially react with the gate area to form a first silicide layer over the gate area;
removing any unreacted metal from the first metal layer over the gate dielectic layer;
forming spacers adjacent to the gate area;
removing the gate dielectric layer over the source and drain areas;
forming a second metal layer over the first silicide layer and the source and drain areas;
applying a second thermal anneal, wherein the second thermal anneal causes (1) the second metal layer to further react with the gate area to enhance the first silicide layer, and (2) the second metal layer to at least partially react with the source and drain areas to form second and third silicide layers; and
removing any unreacted metal from the second metal layer.

2. The method of claim 1, wherein the act of conformally forming a first metal layer comprises a directional metal deposition.

3. The method of claim 2, wherein the directional metal deposition comprises a process selected from a group consisting of collimated, long throw and ionizing plasmas.

4. The method of claim 1, wherein the first thermal anneal comprises a process selected from a group consisting of traditional furnace annealing, rapid annealing and laser annealing.

5. The method of claim 1, wherein the second thermal anneal comprises a process selected from a group consisting of traditional furnace annealing, rapid annealing and laser annealing.

6. The method of claim 1, wherein forming the spacers comprises depositing and etching a first spacer on a first side of the gate area and a second spacer on a second side of the gate area.

7. The method of claim 1, further comprising forming a first lightly-doped area on a first side of the gate area and a second lightly-doped area on a second side of the gate area.

8. The method of claim 1, further comprising defining the source and drain areas.

9. The method of claim 1, further comprising forming a capping layer over the first metal layer.

10. The method of claim 9, wherein a temperature of the first thermal anneal is below a temperature that causes material of the capping layer to diffuse through the first metal layer and reduce a thickness of the gate dielectric layer.

11. The method of claim 1, wherein the first silicide layer is about two to about three times thicker than the second and third silicide layers.

12. The method of claim 1, wherein the second thermal anneal causes substantially all of the second metal layer over the gate area to react with the gate area.

13. The method of claim 1, wherein the first metal layer is selected from the group consisting of Co, Ti, W, Ni and Mo.

14. The method of claim 9, wherein the capping layer is selected from the group consisting of Ti, Al, Li, Mg and Ca.

15. The method of claim 1, wherein the first thermal anneal ranges in temperature from about 300 degrees C. to about 600 degrees C.

16. The method of claim 1, wherein the second thermal anneal ranges in temperature from about 300 degrees C. to about 600 degrees C.

17. The method of claim 1, wherein the first thermal anneal causes about 50% to about 90% of the first metal layer over the gate area to react with the gate area, while the first metal layer over the gate dielectric layer remains substantially unreacted.

18. The method of claim 1, further comprising selecting a thickness of the gate dielectric layer such that the first thermal anneal does not cause a substantial silicide formation over the source and drain areas.

19. The method of claim 1, further comprising controlling a thickness of the first silicide layer over the gate area by controlling thicknesses of the first and second metal layers.

20. The method of claim 1, further comprising controlling a thickness of the first silicide layer over the gate area by controlling a temperature of the first and second thermal anneals.

21. The method of claim 1, further comprising controlling a thickness of the second and third silicide layers by controlling a thickness of the second metal layer.

22. The method of claim 1, further comprising controlling a thickness of the second and third silicide layers by controlling a temperature of the second thermal anneal.

23. The method of claim 9, wherein the act of applying the first thermal anneal is performed before the act of forming a capping layer over the first metal layer.

24. The method of claim 1, further comprising the acts of:
  forming the gate dielectric layer on a substrate;
  depositing a gate layer over the gate dielectric layer;
  forming a mask layer over the gate layer; and
  etching the gate layer to form the gate area.

25. A product made by the method of claim 1.

26. The product of claim 25, further comprising a first spacer on a first side of the gate area and a second spacer on a second side of the gate area.

27. The product of claim 25, further comprising a first lightly-doped area near a first side of the gate area and a second lightly-doped area near a second side of the gate area.

28. The product of claim 25, wherein the gate area comprises polysilicon.

29. The product of claim 25, wherein the spacers comprise a material selected from a group consisting of nitrides and oxides.

30. The method of claim 1, wherein the second metal layer is selected from the group consisting of Co, Ti, W, Ni and Mo.

31. A method of forming a silicide, the method comprising:
  conformally forming a first metal layer over a gate area and a gate dielectric layer, the gate dielectric layer covering a source area and a drain area;
  applying a fist thermal anneal that causes the first metal layer to at least partially react with the gate area to form a first silicide layer over the gate area;
  forming a capping layer over the first metal layer, wherein the first thermal anneal is applied before forming a capping layer over the first metal layer;
  removing any unreacted metal from the first metal layer over the gate dielectric layer;
  removing the gate dielectric layer over the source and drain areas;
  forming a second metal layer over the first silicide layer and the source and drain areas;
  applying a second thermal anneal, wherein the second thermal anneal causes (1) the second metal layer to further react with the gate area to enhance the first silicide layer, and (2) the second metal layer to at least partially react with the source and drain areas to form second and third silicide layers; and
  removing any unreacted metal from the second metal layer.

32. A method of forming a silicide, the method comprising:
  conformally forming a first metal layer over a gate area and a gate dielectric layer before forming spacers adjacent to the gate area, the gate dielectric layer covering a source area and a drain area;
  applying a first thermal anneal that causes the first metal layer to at least partially react with the gate area to form a first silicide layer over the gate area;
  removing any unreacted metal from the first metal layer over the gate dielectric layer;
  forming spacers adjacent to the gate area;
  removing the gate dielectric layer over the source and drain areas;
  forming a second metal layer over the first silicide layer and the source and drain areas; and
  applying a second thermal anneal, wherein the second thermal anneal causes (1) the second metal layer to further react with the gate area to enhance the first silicide layer, wherein the second thermal anneal causes substantially all of the second metal layer over the gate area to react with the gate area, and (2) the second metal layer to at least partially react with the source and drain areas to form second and third silicide layers.

* * * * *